US010573766B2

(12) United States Patent
Matsui et al.

(10) Patent No.: US 10,573,766 B2
(45) Date of Patent: Feb. 25, 2020

(54) SOLAR CELL

(71) Applicant: Panasonic Corporation, Osaka (JP)

(72) Inventors: Taisuke Matsui, Osaka (JP); Takayuki Negami, Osaka (JP); Takashi Sekiguchi, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/199,748

(22) Filed: Nov. 26, 2018

(65) Prior Publication Data
US 2019/0237598 A1 Aug. 1, 2019

(30) Foreign Application Priority Data
Feb. 1, 2018 (JP) .................. 2018-016571

(51) Int. Cl.
*H01L 31/0224* (2006.01)
*H01L 31/0248* (2006.01)
(Continued)

(52) U.S. Cl.
CPC .... *H01L 31/022425* (2013.01); *H01L 31/032* (2013.01); *H01L 31/055* (2013.01);
(Continued)

(58) Field of Classification Search
CPC ............ H01L 31/0248; H01L 31/0256; H01L 31/0264; H01L 31/02
See application file for complete search history.

(56) References Cited

U.S. PATENT DOCUMENTS 9,419,234 B2    8/2016  Machida et al.
2016/0254449 A1*  9/2016  Shinohara ............. C07C 213/02
                                                 252/519.3
(Continued)

FOREIGN PATENT DOCUMENTS

JP       2017-126731       7/2017
WO       2012/133858      10/2012

OTHER PUBLICATIONS

Dongqin Bi et al., "High-efficient solid-state perovskite solar cell without lithium salt in the hole transport material", NANO: Brief Reports and Reviews vol. 9, No. 5 (2014) 1440001 (7 pages).
(Continued)

*Primary Examiner* — Susan D Leong
(74) *Attorney, Agent, or Firm* — McDermott Will & Emery LLP

(57) ABSTRACT

Provided is a solar cell comprising a first electrode; a second electrode; a perovskite photoabsorber layer located between the first electrode and the second electrode; a first semiconductor layer located between the first electrode and the photoabsorber layer; and a second semiconductor layer located between the second electrode and the photoabsorber layer. At least one electrode selected from the group consisting of the first electrode and the second electrode is light-transmissive. The first semiconductor layer contains Li. The second semiconductor layer contains $LiN(SO_2CF_3)_2$. The second semiconductor layer contains poly[bis(4-phenyl)(2,4,6-trimethylphenyl)amine]. In the second semiconductor layer, a molar ratio of $LiN(SO_2CF_3)_2$ to poly[bis(4-phenyl)(2,4,6-trimethylphenyl)amine] is not less than 0.15 and not more than 0.26.

4 Claims, 1 Drawing Sheet

(51) Int. Cl.
  *H01L 31/055*  (2014.01)
  *H01L 51/44*  (2006.01)
  *H01L 51/42*  (2006.01)
  *H01L 31/032*  (2006.01)

(52) U.S. Cl.
  CPC ...... *H01L 51/4206* (2013.01); *H01L 51/4226* (2013.01); *H01L 51/441* (2013.01)

(56) References Cited

U.S. PATENT DOCUMENTS

2016/0359119 A1 12/2016 Hayashi et al.
2018/0374655 A1* 12/2018 Jin .......................... H01L 31/02

OTHER PUBLICATIONS

Woon Seok Yang et al., "High-performance photovoltaic perovskite layers fabricated through intramolecular exchange", Science, Jun. 12, 2015, vol. 348, Issue 6240, pp. 1234-1237 and Supplementary Material.
Fabrizio Giordano et al., "Enhanced electronic properties in mesoporous $TiO_2$ via lithium doping for high-efficiency perovskite solar cells", Nature Communications, 7:10379, Jan. 13, 2016.

* cited by examiner

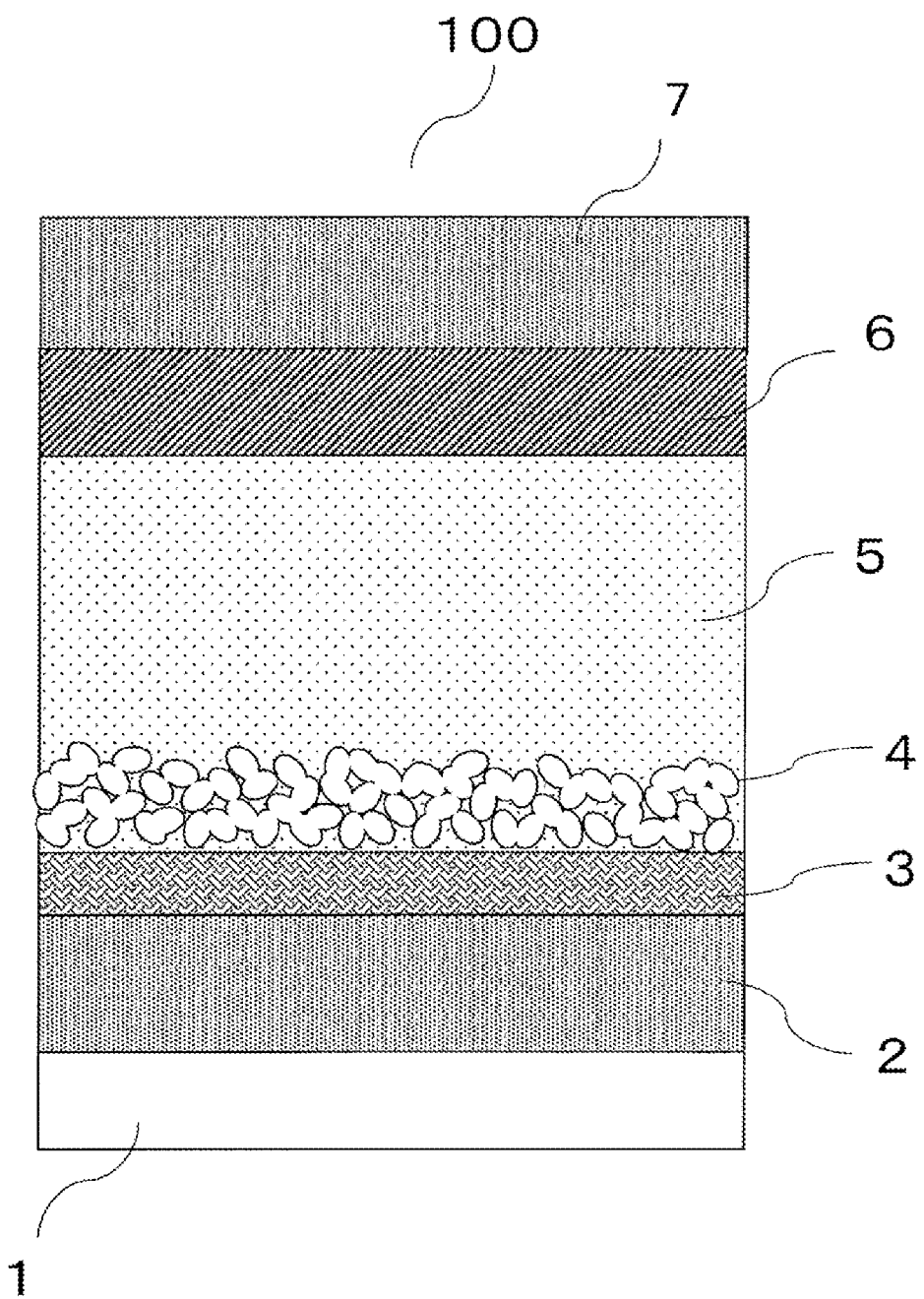

SOLAR CELL

BACKGROUND

1. Technical Field

The present disclosure relates to a solar cell. In particular, the present disclosure relates to a solar cell including a perovskite crystal as a photoabsorber.

2. Description of the Related Art

A perovskite solar cell has been recently researched and developed. In the perovskite solar cell, a perovskite compound formed of a perovskite crystal structure represented by the composition formula $AMX_3$ (where A is a monovalent cation, M is a divalent cation, and X is a halogen anion) or a structure similar thereto is used as a photoabsorber.

Non-Patent Literature 1 discloses that a solar cell including $TiO_2$, poly[bis(4-phenyl)(2,4,6-trimethylphenyl)amine], and a perovskite compound represented by the chemical formula $CH_3NH_3PbI_3$, as an electron transport material, an hole transport material, and a photoabsorber of a perovskite solar cell, respectively.

CITATION LIST

Non-Patent Literature

Non-Patent Literature 1: Dongqin Bi et. al., "High-efficient solid-state perovskite solar cell without lithium salt in the hole transport material", NANO, Brief Reports and Reviews Vol. 9, No. 5 (2014) 1440001 (7 pages)

Non-Patent Literature 2: Woon Seok Yang et. al., "High-performance photovoltaic perovskite layers fabricated through intramolecular exchange" Science, 12 Jun. 2015, Vol. 348, Issue 6240, pp. 1234-1237

SUMMARY

An object of the present disclosure is to provide a perovskite solar cell having a high conversion efficiency and high durability.

The present disclosure provides a solar cell, comprising:
a first electrode;
a second electrode;
a photoabsorber layer located between the first electrode and the second electrode;
a first semiconductor layer located between the first electrode and the photoabsorber layer; and
a second semiconductor layer located between the second electrode and the photoabsorber layer,
wherein
at least one electrode selected from the group consisting of the first electrode and the second electrode is light-transmissive;
the photoabsorber layer contains a perovskite compound represented by the composition formula $AMX_3$;
where
A represents a monovalent cation,
M represents a divalent cation, and
X represents a halogen anion,
the first semiconductor layer contains Li;
the second semiconductor layer contains $LiN(SO_2CF_3)_2$;
the second semiconductor layer contains poly[bis(4-phenyl)(2,4,6-trimethylphenyl)amine]; and
in the second semiconductor layer, a molar ratio of $LiN(SO_2CF_3)_2$ to poly[bis(4-phenyl)(2,4,6-trimethylphenyl)amine] is not less than 0.15 and not more than 0.26.

The present disclosure provides a perovskite solar cell having high conversion efficiency and high durability.

BRIEF DESCRIPTION OF THE DRAWING

FIG. 1 shows a cross-sectional view of a solar cell according to the embodiment.

DETAILED DESCRIPTION OF THE EMBODIMENT

Hereinafter, the embodiment of the present disclosure will be described with reference to the drawing.

(Findings Which Established the Foundation of the Present Disclosure)

The findings which established the foundation of the present disclosure will be described below.

In a perovskite solar cell, an additive agent is added to a hole transport material to improve electric conductivity of the hole transport material. As a result, conversion efficiency of the perovskite solar cell is improved. As the additive agent which is added to the hole transport material, for example, $LiN(SO_2CF_3)_2$ is widely used. Hereinafter, $LiN(SO_2CF_3)_2$ is referred to as "LiTFSI".

However, in a case where the additive agent is added to the hole transport material to improve electric conductivity of the hole transport material, after the perovskite solar cell is irradiated with sunlight for a long time, the additive agent may be dispersed due to thermal dispersion from the hole transport material to other materials. As a result, photovoltaic performance of the perovskite solar cell may be lowered.

The present inventors found a technical problem that the value of (conversion efficiency after heating)/(initial conversion efficiency) (which will be referred to as "maintenance ratio" in the example which will be described later) is lowered due to significant decrease in both open voltage (i.e., Voc) and form factor (i.e, FF) of the perovskite solar cell, if the perovskite solar cell including LiTFSI as the additive agent of the hole transport material is left at high temperature of approximately 85 degrees Celsius. The present inventors believe that the problem is caused as below. First, when the perovskite solar cell is left at high temperature, LiTFSI is dispersed from the hole transport material to an electron transport material. As a result, the electric conductivity of the hole transport material is lowered. In addition, electric charge extraction efficiency at an interface between the electron transport material and a perovskite electric power generation layer is lowered.

To solve the problem, the present inventors found that Li is added in advance to the electron transport material to prevent LiTFSI from being dispersed from the hole transport material to an electron transport material. According to the finding, a decrease in the electric conductivity of the hole transport material due to heat dispersion of LiTFSI is prevented. Therefore, the durability of the perovskite solar cell is improved.

In addition, Li is added in advance to the electron transport material to maintain the durability of the perovskite solar cell and to allow LiTFSI to be added to the hole transport material at higher concentration than that of a conventional perovskite solar cell. The addition of the LiTFSI at higher concentration further improves the efficiency of the perovskite solar cell. In this way, the perovskite solar cell according to the present embodiment has high durability and high conversion efficiency.

Description of Abbreviations

The term "FA$^+$" or "FA" used in the instant specification means formamidinium cation represented by the chemical formula CH(NH$_2$)$_2$$^+$. For example, FAI means formamidinium iodide represented by the chemical formula CH(NH$_2$)$_2$I.

The term "MA$^+$" or "MA" used in the instant specification means methylammonium cation represented by the chemical formula CH$_3$NH$_3$$^+$. For example, MAPbI$_3$ means methylammonium lead triiodide represented by the chemical formula CH$_3$NH$_3$PbI$_3$.

The term "LiTFSI" used in the instant specification means lithium bis(trifluoromethanesulfonyl)imide represented by the chemical formula LiN(SO$_2$CF$_3$)$_2$.

The term "PTAA" used in the instant specification means poly[bis(4-phenyl)(2,4,6-trimethylphenyl)amine].

The term "photoabsorber" used in the instant specification means a photoelectric conversion material capable of converting light into electric energy.

Embodiment

FIG. 1 shows a cross-sectional view of a solar cell 100 according to the embodiment.

The solar cell 100 according to the embodiment comprises a first electrode 2, a first semiconductor layer 3, a photoabsorber layer 5, a second semiconductor layer 6, and a second electrode 7. The photoabsorber layer 5 may further comprise a porous layer 4 which is in contact with the first semiconductor layer 3. The first electrode 2, the second electrode 7, the first semiconductor layer 3, and the second semiconductor layer 6 serve as a negative electrode, a positive electrode, the electron transport layer, and the hole transport layer.

At least one of the first electrode 2 and the second electrode 7 is light-transmissive.

The photoabsorber layer 5 is located between the first electrode 2 and the second electrode 7 and contains a perovskite compound represented by the composition formula AMX$_3$ (where A is a monovalent cation, M is a divalent cation, and X is a halogen anion). Both the first semiconductor layer 3 and the second semiconductor layer 6 are carrier transport layers. The first semiconductor layer 3 is located between the first electrode 2 and the photoabsorber layer 5. The first semiconductor layer 3 contains an electron transport material and Li. The second semiconductor layer 6 is located between the second electrode 7 and the photoabsorber layer 5. The second semiconductor layer 6 contains a hole transport material and LiTFSI.

The solar cell 100 may comprise a substrate 1. In this case, the first electrode 2 is located on the substrate 1.

Hereinafter, the functional effect of the solar cell 100 will be described.

When the solar cell 100 is irradiated with light, the light is absorbed in the photoabsorber layer 5 to generated excited electrons and holes. The excited holes migrate to the first semiconductor layer 3. On the other hand, the holes generated in the photoabsorber layer 5 migrate to the second semiconductor layer 6. The first semiconductor layer 3 and the second semiconductor layer 6 are electrically connected to the first electrode 2 and the second electrode 7, respectively. In this way, electric current is taken out from the first electrode 2 and the second electrode 7, which serve as the negative electrode and the positive electrode, respectively.

The first semiconductor layer 3 contains Li to raise Li concentration of the first semiconductor layer 3. The raise of the Li concentration prevents the LiTFSI contained in the second semiconductor layer 6 from being dispersed toward the first semiconductor layer 3. As a result, the durability of the solar cell 100 due to the dispersion of the LiTFSI is prevented from being lowered.

Note that in a conventional solar cell, the electron transport layer does not contain Li, before the solar cell is operated. In a case where hole transport layer contains Li, as described above, the solar cell is operated at high temperature to disperse Li cations from the hole transport layer toward the electron transport layer. However, Li cations dispersed from the hole transport layer toward the electron transport layer are not taken in a crystal of the material which constitutes the electron transport layer. The dispersed Li cations are present intensively as a Li atom at an interface between the electron transport layer and the photoabsorber layer. On the other hand, in the present embodiment, Li is added in advance to the first semiconductor layer 3. The first semiconductor layer 3 is formed, for example, by adding Li to a semiconductor layer containing the electron transport material, and then, heating the semiconductor layer. In this case, in the first semiconductor layer 3, Li atoms are located in the crystal structure of the electron transport material. In particular, the Li atoms are located so as to compensate vacancies in the crystal of the electron transport material. The bonding state of the Li atom can be observed, for example, using an X-ray photoelectron spectroscopy (hereinafter, referred to as "XPS"). On the basis of the XPS measurement, it is determined about whether or not the Li atom is bound to an atom included in the electron transport material.

In the present embodiment, LiTFSI is allowed to be added to the second semiconductor layer 6 at higher concentration than to the hole transport layer of the conventional perovskite solar cell.

It was difficult to add LiTFSI at high concentration to the hole transport material of the conventional perovskite solar cell. For example, Non-patent Literature 1 and Non-patent Literature 2 disclose that PTAA is used as the hole transport material and that LiTFSI is added to PTAA. According to Non-patent Literature 1, a molar ratio of LiTFSI to a repeat unit of PTAA (namely, a repeat unit represented by the chemical formula —(C$_6$H$_4$)—NR—(C$_6$H$_4$)—, where R represents 1,3,5-trimethylphenyl group, molecular weight: 285) is 0.086. Hereinafter, the molar ratio of LiTFSI to a repeat unit of PTAA is referred to as a molar ratio of LiTFSI to PTAA. According to Non-patent Literature 2, the molar ratio of LiTFSI to PTAA is 0.126. In both Non-patent Literature 1 and Non-patent Literature 2, the molar ratio of LiTFSI to PTAA is less than 0.15. The present inventors believe that this is because, if the additive amount of LiTFSI is too much, redundant LiTFSI may be dispersed to lower the durability of the solar cell. In particular, for example, the redundant LiTFSI may be dispersed from the hole transport material to lower the electric conductivity of the hole transport layer. In addition, for example, the dispersed LiTFSI may be adsorbed onto the surface of the electron transport layer to lower the injection efficiency of the electron to the electron transport layer. Alternatively, LiTFSI itself (or, water molecular held by LiTFSI) may react with the perovskite compound to decompose the perovskite compound.

On the other hand, in the solar cell according to the present embodiment, LiTFSI is prevented from being dispersed from the second semiconductor layer 6 toward the first semiconductor layer 3. As a result, the durability of the solar cell is prevented from being lowered. Furthermore, the concentration of the LiTFSI contained in the second semiconductor layer 6 is further increased. In the solar cell according to the present embodiment, the second semiconductor layer 6 contains PTAA as the hole transport material and the molar ratio of LiTFSI to PTAA is not less than 0.15 in the second semiconductor layer 6. As the concentration of LiTFSI is larger, the electric conductivity of the second semiconductor layer 6 is larger. As a result, electron extraction speed at the first semiconductor layer 3 of the solar cell 100 is increased. In other words, electron extraction speed at the n-type side is increased. Likewise, hole extraction speed at the second semiconductor layer 6 of the solar cell 100 is increased. In other words, hole extraction speed at the p-type side is increased. As a result, the solar cell according to the present embodiment converts light into electric energy highly efficiently. In this way, the high durability is maintained and the conversion efficiency is improved efficiently.

The solar cell 100 according to the present embodiment is fabricated, for example, by the following method. First, the first electrode 2 is formed on the surface of the substrate 1 by a chemical vapor deposition method or by a sputtering method. Then, the first semiconductor layer 3 is formed by a sputtering method on the first electrode 2. The porous layer 4 is formed by a coating method on the first semiconductor layer 3. Subsequently, the photoabsorber layer 5 is formed by a coating method on the porous layer 4. Then, the second semiconductor layer 6 is formed by a coating method on the photoabsorber layer 5. Finally, the second electrode 7 is formed on the second semiconductor layer 6. In this way, the solar cell 100 according to the present embodiment is fabricated.

Hereinafter, the detail of the solar cell 100 will be described.

(Substrate 1)

The substrate 1 holds the layers of the solar cell 100. The substrate 1 may be formed of a transparent material. An example of substrate 1 is a glass substrate or a plastic substrate. An example of the plastic substrate is a plastic film. When the second electrode 7 is light-transmissive, the substrate 1 does not have to have light-transparency. For example, the substrate 1 may be formed of a metal, a ceramics, or a resin material having a small light-transmissivity.

When the first electrode 2 has sufficient strength, the first semiconductor layer 3, the porous layer 4, the photoabsorber layer 5, the second semiconductor layer 6, and the second electrode 7 can be stacked on or above the first electrode 2. Therefore, the solar cell 100 does not have to comprise the substrate 1.

(First Electrode 2)

The first electrode 2 has an electric conductivity. The first electrode 2 may be light-transmissive. Light from visible light to near-infrared light passes through the first electrode 2. The first electrode 2 may be formed of a transparent and electrically-conductive metal oxide and/or nitride. An example of the material for the first electrode 2 is (i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) indium-tin composite oxide;

(v) tin oxide doped with at least one selected from the group consisting of antimony and fluorine;

(vi) zinc oxide doped with at least one selected from the group consisting of boron, aluminum, gallium, and indium; or (vii) a composite thereof.

The first electrode 2 may be formed by providing a pattern through which light passes using a non-transparent material. An example of the pattern through which the light passes is a line (namely, a stripe), a wave, a grid (namely, a mesh), or a punching metal pattern on which a lot of fine through holes are arranged regularly or irregularly. When the first electrode 2 has the above-mentioned pattern, light can travel through an opening part in which an electrode material is absent. An example of the non-transparent material is platinum, gold, silver, copper, aluminum, rhodium, indium, titanium, iron, nickel, tin, zinc, or alloy containing at least two selected therefrom. An electrically-conductive carbon material may be used as the non-transparent material.

Light-transmissivity of the first electrode 2 is, for example, not less than 50%, or not less than 80%. A wavelength of the light which passes through the first electrode 2 is dependent on a wavelength of the light which is absorbed into the photoabsorber layer 5. The first electrode 2 has a thickness of, for example, not less than 1 nanometer and not more than 1,000 nanometers.

(First Semiconductor Layer 3)

The first semiconductor layer 3 contains a semiconductor. The first semiconductor layer 3 may be formed of a semiconductor having a bandgap of not less than 3.0 eV. Visible light and infrared light travels through the first semiconductor layer 3 formed of the semiconductor having a bandgap of not less than 3.0 eV to reach the photoabsorber layer 5. An example of the semiconductor is an organic or inorganic n-type semiconductor.

An example of the organic n-type semiconductor is an imide compound, a quinone compound, fullerene, or derivative of fullerene. An example of the inorganic n-type semiconductor is a metal oxide, a metal nitride, or a perovskite oxide. An example of the metal oxide is an oxide of Cd, Zn, In, Pb, Mo, W, Sb, Bi, Cu, Hg, Ti, Ag, Mn, Fe, V, Sn, Zr, Sr, Ga, or Cr. $TiO_2$ is desirable. An example of the metal nitride is GaN. An example of the perovskite oxide is $SrTiO_3$ or $CaTiO_3$.

The first semiconductor layer 3 may be formed of a material having a bandgap of more than 6.0 eV. An example of the material having a bandgap of more than 6.0 eV is a halide of an alkali metal or alkali-earth metal (e.g., lithium fluoride or calcium fluoride), an alkali metal oxide such as magnesium oxide, or silicon dioxide. In this case, to ensure the electron transport property, the first semiconductor layer 3 has a thickness of, for example, not more than 10 nanometers.

The first semiconductor layer 3 may be formed of one layer formed of the above-mentioned semiconductor. Alternatively, the first semiconductor layer 3 may include a plurality of layers each formed of a material different to each other.

In the present embodiment, the first semiconductor layer 3 contains Li. The first semiconductor layer 3 is formed, for example, by adding Li to a semiconductor layer containing the electron transport material, and then, sintering the semiconductor layer. Alternatively, the first semiconductor layer 3 may be formed by sintering a mixture of the compound containing Li and the starting material of the electron transport material.

The first semiconductor layer 3 may contain titanium oxide represented by the chemical formula $TiO_2$ mainly. In this case, a molar ratio of Li to Ti included in the first semiconductor layer 3 may be not less than 0.02. Titanium oxide prevents the LiTFSI contained in the second semiconductor layer 6 from being dispersed toward the first semiconductor layer 3. The molar ratio of Li to Ti included in the first semiconductor layer 3 may be not more than 0.06. The excess amount of Li included in the first semiconductor layer 3 may cause an insulation layer formed of $LiO_x$ to be formed. Therefore, if the molar ratio of Li to Ti included in the first semiconductor layer 3 is not more than 0.06, $LiO_x$ is prevented from being formed. In this way, electric charge is efficiently injected from the photoabsorber layer 5 to the first semiconductor layer 3.

(Porous Layer 4)

The porous layer 4 becomes a foothold of the formation of the photoabsorber layer 5. The porous layer 4 does not prevent the photoabsorber layer 5 from absorbing the light. In addition, the porous layer 4 does not prevent the electrons from migrating from the photoabsorber layer 5 to the first semiconductor layer 3.

The porous layer 4 contains the porous material. An example of the porous material is a porous material in which insulative or semiconductor particles are connected. An example of the material of the insulative particles is particles of aluminum oxide or silicon oxide. An example of the material of the semiconductor particles is an inorganic semiconductor. The example of the inorganic semiconductor is a metal oxide (including a metal perovskite oxide), a metal sulfide, or a metal chalcogenide. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the perovskite oxide is $SrTiO_3$ or $CaTiO_3$. An example of the metal sulfide is CdS, ZnS, $In_2S_3$, PbS, $Mo_2S$, $WS_2$, $Sb_2S_3$, $Bi_2S_3$, $ZnCdS_2$, or $Cu_2S$. An example of the metal chalcogenide is CdSe, $In_2Se_3$, $WSe_2$, HgS, PbSe, or CdTe.

The porous layer 4 may have a thickness of not less than 0.01 micrometer and not more than 10 micrometers, or not less than 0.1 micrometer and not more than 1 micrometer. The porous layer 4 may have a large surface roughness. In particular, it is desirable that surface roughness coefficient defined by a value of an effective area/a projected area is not less than 10. It is more desirable that the surface roughness coefficient is not less than 100. The effective area is an actual area of a surface of the object. The projected area is an area of a shadow of an object formed posteriorly to the object when light travelling from the front of the object is incident on the object. The effective area can be calculated from a volume calculated from the projected area and the thickness of the object, a specific surface area of the material which constitutes the object, and a bulk density of the object. The specific surface area is measured, for example, by a nitrogen adsorption method.

The porous layer 4 may contain Li. The porous layer containing Li prevents LiTFSI contained in the second semiconductor layer 6 from more efficiently being dispersed toward the first semiconductor layer 3.

Note that the solar cell 100 according to the present embodiment does not have to have the porous layer 4.

(Photoabsorber Layer 5)

The photoabsorber layer 5 contains a perovskite compound represented by the composition formula $AMX_3$. A is a monovalent cation. An example of the monovalent cation A is an alkali metal cation or a monovalent organic cation. An example of the alkali metal cation is $Cs^+$. An example of the monovalent organic cation is a methylammonium cation represented by the chemical formula $CH_3NH_3^+$ or a formamidinium cation represented by the chemical formula $NH_2CHNH_2^+$. M is a divalent cation. An example of the divalent cation M is a Pb cation or Sn cation. X is a monovalent anion such as a halogen anion.

Pursuant to the expression used conventionally for the perovskite compound, A, M, and X are referred to as "A site", "M site", and "X site" in the instant specification, respectively.

Each of the A site, M site, and X site may be occupied by a plurality of kinds of ions.

The photoabsorber layer 5 has a thickness of, for example, not less than 100 nanometers and not more than 1,000 nanometers. The photoabsorber layer 5 may be formed with a solution by coating method.

(Second Semiconductor Layer 6)

The second semiconductor layer 6 contains PTAA and LiTFSI. The molar ratio of LiTFSI to PTAA will be described later. The second semiconductor layer 6 is composed of an organic semiconductor or an inorganic semiconductor. The second semiconductor layer 6 may include a plurality of layers formed of materials different from each other.

An example of the material of the organic semiconductor is a phenylamine derivative, which includes tertiary amine in the skeleton thereof;

a triphenylamine derivative, which includes tertiary amine in the skeleton thereof, or a PEDOT compound including a thiophene structure.

The molecular weight of the organic semiconductor is not limited. The organic semiconductor may be a polymer.

An example of the material of the organic semiconductor is:

(i) 2,2',7,7'-tetrakis-(N,N-di-p-methoxyphenylamine) 9, 9'-spirobifluorene (hereinafter, referred to as "spiro-OMeTAD"), (ii) poly[bis(4-phenyl)(2,4,6-trimethylphenyl)amine] (hereinafter, referred to as "PTAA"), (iii) poly(3-hexylthiophene-2,5-diyl) (hereinafter, referred to as "$P_3HT$"), (iv) poly(3,4-ethylenedioxythiophene) (hereinafter, referred to as "PEDOT"), or (v) copper phthalocyanine (hereinafter, referred to as "CuPC").

An example of the material of the inorganic semiconductor is $Cu_2O$, $CuGaO_2$ CuSCN, CuI, $NiO_x$, $MoO_x$, or $V_2O_5$. A carbon material such as graphene oxide may be used as the inorganic semiconductor.

It is desirable that the second semiconductor layer 6 may have a thickness of not less than 1 nanometer and not more than 1,000 nanometers. It is more desirable that the thickness is not less than 10 nanometers and not more than 500 nanometers. Within this range, the hole transport property is provided sufficiently. Due to maintenance of low resistance, electric power is generated from light with high efficiency.

As a formation method of the second semiconductor layer 6, a coating method or a printing method can be employed. An example of the coating method is a doctor blade method, a bar coating method, a spraying method, a dip coating method, or a spin-coating method. An example of the printing method is a screen printing method. If necessary, the second semiconductor layer 6 is provided by forming a film using a mixture of plural materials, and then, applying a pressure to the film or sintering the film. When the material of the second semiconductor layer 6 is an organic low-molecular material or an inorganic semiconductor, the second semiconductor layer 6 may be formed by a vacuum evaporation method.

The second semiconductor layer 6 may contain a supporting electrolyte and a solvent. The supporting electrolyte and the solvent stabilize the holes included in the second semiconductor layer 6.

An example of the supporting electrolyte is an ammonium salt or an alkali metal salt. An example of the ammonium salt is tetrabutylammonium perchlorate, tetraethylammonium hexafluorophosphate, an imidazolium salt, or a pyridinium salt. An example of the alkali metal salt is $LiPF_6$, $LiBF_4$, lithium perchlorate, or potassium tetrafluoroborate.

The solvent contained in the second semiconductor layer 6 may have high ionic conductivity. As the solvent, both an aqueous solvent and an organic solvent may be used. In view of more stabilization of the solvent, the organic solvent is desirable. An example of the organic solvent is a heterocyclic compound solvent such as tert-butylpyridine, pyridine, or n-methylpyrrolidone.

As the solvent, an ionic liquid may be used solely. Alternatively, as the solvent, a mixture of an ionic liquid and another solvent may be used. The ionic liquid is desirable in view of its low volatility and high fire retardancy.

An example of the ionic liquid is an imidazolium-type ionic liquid such as 1-ethyl-3-methylimidazolium tetracyanoborate, a pyridine-type ionic liquid, an alicyclic amine-type ionic liquid, an aliphatic amine-type ionic liquid, or an azonium amine-type ionic liquid.

The second semiconductor layer 6 contains LiTFSI as the additive agent. The second semiconductor layer 6 is formed, for example, by applying a solution containing the semiconductor material, the additive agent, and the supporting electrolyte to the photoabsorber layer 5. For this reason, it is desirable to choose, as the additive agent, the material which is dissolvable in the above solvent and is not precipitated even if the additive agent reacts with the semiconductor material to form a composite. LiTFSI is a material which satisfies these requirements and provides significantly high efficiency.

The second semiconductor layer 6 may contain PTAA mainly. Since the HOMO energy level of PTAA is relatively close to the level of the valence band of the perovskite compound contained in the photoabsorber layer 5, holes migrate easily from the photoabsorber layer 5 to PTAA. Since high hole mobility is provided in the solar cell 100 due to the easy migration of the holes, the efficiency of the solar cell 100 is improved. In addition, PTAA has high thermal stability. Therefore, PTAA is used as the semiconductor material of the second semiconductor layer 6 (namely, used as the hole transport material) to improve the conversion efficiency and the durability of the solar cell 100 more.

In the second semiconductor layer 6, the molar ratio of LiTFSI to PTAA is not less than 0.15 and not more than 0.26. As demonstrated in the samples 5, 6, and 12 which will be included in the example which will be described later, in case where the molar ratio is less than 0.15, initial conversion efficiency is a low value of not more than 16.5%. On the other hand, as is clear from comparison of the sample 11 to the samples 9 and 10, in case where the molar ratio is not less than 0.28, the initial conversion efficiency is suddenly degraded to be a low value of not more than 15.9%.

As demonstrated in the samples 6 and 7, in case where the first semiconductor layer 3 does not contain Li, the maintenance ratio is a low value of not more than 73%.

As just described, the following requirements (i) and (ii) are required to be satisfied for high the initial conversion efficiency and the high maintenance ratio.

(i) The first semiconductor layer 3 contains Li.
(ii) The molar ratio of LiTFSI to PTAA is not less than 0.15 and not more than 0.26 in the second semiconductor layer 6.

(Second Electrode 7)

The second electrode 7 has an electric conductivity. The second electrode 7 may be light-transmissive. The second electrode 7 may be formed in the same way as the case of the first electrode 2.

At least one selected from the group consisting of the first electrode 2 and the second electrode 7 is a light-transmissive electrode through which light passes. Therefore, if the second electrode 7 is light-transmissive, the first electrode 2 does not have to be light-transmissive.

The configuration of the solar cell 100 according to the present embodiment is not limited to the example shown in FIG. 1. In FIG. 1, the first electrode 2, the first semiconductor layer 3, the photoabsorber layer 5, the second semiconductor layer 6, the second electrode 7 are stacked on the substrate 1 in this order. Alternatively, the second electrode 7, the second semiconductor layer 6, the photoabsorber layer 5, the first semiconductor layer 3, and first electrode 2 may be stacked on the substrate 1 in this order.

EXAMPLES

Hereinafter, the solar cell according to the present disclosure will be described with reference to the following examples. As will be described below, the solar cells according to the sample 1-sample 12 were fabricated. The properties thereof were evaluated.

(Sample 1)

The solar cell 100 shown in FIG. 1 was fabricated.

The fabrication method of the solar cell of the sample 1 will be described.

First, a glass substrate having an electric conductive layer which served as the first electrode 2 was prepared. The glass substrate was a product of Nippon Sheet Glass Co. Ltd. An indium-doped $SnO_2$ layer served as the first electrode 2. The glass substrate had a thickness of 1 millimeter. The first electrode 2 had a surface resistance of 10 ohms/sq.

Next, a titanium oxide layer having a thickness of 10 nanometers was formed on the first electrode 2 by a sputtering method. In this way, the first semiconductor layer 3 was formed on the first electrode 2.

Highly pure titanium oxide powder having a mean primary particle diameter of 30 nanometers was dispersed in ethyl cellulose to prepare a titanium oxide paste. The prepared titanium oxide paste was applied to the first semiconductor layer 3 by a screen printing method, and then, the paste was dried. Subsequently, the titanium oxide paste was sintered in air at temperature of 500 degrees Celsius for 30 minutes to form the porous layer 4 composed of a porous titanium oxide layer having a thickness of 0.2 micrometers.

Apart from this, LiTFSI (10 milligrams) was dissolved in acetonitrile (1 milliliter) to prepare a Li-containing solution. Drops of the Li-containing solution were put on the porous layer 4, and then, the Li-containing solution permeated the first semiconductor layer 3 and the porous layer 4 by a spin-coating method. Subsequently, the first semiconductor layer 3 and the porous layer 4 were sintered in air at temperature of 500 degrees Celsius for 30 minutes. In this way, Li was added to both the porous layer 4 and the first semiconductor layer 3.

Next, N,N-dimethylformamide (hereinafter, referred to as "DMF") and dimethylsulfoxide (hereinafter, referred to as "DMSO") were mixed at a ratio of 4:1 (volume ratio) to prepare a mixture solvent. The following reagents (I)-(VI) were dissolved in the mixture solvent so as to have the following concentration. In this way, a first mixture solution was prepared.

| (I) PbI$_2$ | (0.92 mol/L), |
|---|---|
| (II) PbBr$_2$ | (0.17 mol/L), |
| (III) FAI | (0.83 mol/L), |
| (IV) MABr | (0.17 mol/L), |
| (V) CsI | (0.05 mol/L), and |
| (VI) RbI | (0.05 mol/L). |

The first mixture solution was applied to the porous layer 4 by a spin-coating method. Subsequently, the substrate 1 was put on a hot plate, and then, heated at temperature of 100 degrees Celsius to form the photoabsorber layer 5. The photoabsorber layer 5 contained a perovskite compound represented by the chemical formula $(FAPbI_3)_{0.83}(MAPbI_3)_{0.17}$.

Further, tert-butylpyridine (5 microliters, hereinafter, referred to as "tBP") and an acetonitrile solution containing LiTFSI at a concentration of 1.8 mol/L were added to a toluene solution (1 milliliter) containing PTAA at a concentration of 10 mg/mL. The volume of the added acetonitrile solution was 3 microliters. In this way, a second mixture solution was prepared. The second mixture solution was applied to the photoabsorber layer 5 by a spin-coating method to form the second semiconductor layer 6.

Finally, Au was deposited on the second semiconductor layer 6 to form the second electrode 7 having a thickness of 80 nanometers. In this way, the solar cell 100 of the sample 1 was fabricated.

All the above steps were conducted in a dry room having a dew point of not more than minus 40 degrees Celsius.

(Sample 2)

The solar cell of the sample 2 was fabricated in the way similar to the sample 1, except that:

(i) the weight of LiTFSI contained in the Li-containing solution was not 10 milligrams but 3 milligrams; and (ii) the volume of the acetonitrile solution was not 3 microliters but 4.8 microliters.

(Sample 3)

The solar cell of the sample 3 was fabricated in the way similar to the sample 1, except that the volume of the acetonitrile solution was not 3 microliters but 4.8 microliters.

(Sample 4)

The solar cell of the sample 4 was fabricated in the way similar to the sample 1, except that:

(i) the weight of LiTFSI contained in the Li-containing solution was not 10 milligrams but 30 milligrams; and (ii) the volume of the acetonitrile solution was not 3 microliters but 4.8 microliters.

(Sample 5)

The solar cell of the sample 5 was fabricated in the way similar to the sample 1, except that the volume of the acetonitrile solution was not 3 microliters but 0.6 microliters.

(Sample 6)

The solar cell of the sample 6 was fabricated in the way similar to the sample 1, except that:

(i) Li was not added to either the porous layer 4 or the first semiconductor layer 3; and (ii) the volume of the acetonitrile solution was not 3 microliters but 0.6 microliters.

(Sample 7)

The solar cell of the sample 7 was fabricated in the way similar to the sample 1, except that:

(i) Li was not added to either the porous layer 4 or the first semiconductor layer 3; and (ii) the volume of the acetonitrile solution was not 3 microliters but 4.8 microliters.

(Sample 8)

The solar cell of the sample 8 was fabricated in the way similar to the sample 1, except that:

(i) Li was not added to either the porous layer 4 or the first semiconductor layer 3; and (ii) the volume of the acetonitrile solution was not 3 microliters but 6.0 microliters.

(Sample 9)

The solar cell of the sample 9 was fabricated in the way similar to the sample 1, except that the volume of the acetonitrile solution was not 3 microliters but 6.0 microliters.

(Sample 10)

The solar cell of the sample 10 was fabricated in the way similar to the sample 1, except that the volume of the acetonitrile solution was not 3 microliters but 5.6 microliters.

(Sample 11)

The solar cell of the sample 11 was fabricated in the way similar to the sample 1, except that the volume of the acetonitrile solution was not 3 microliters but 5.2 microliters.

(Sample 12)

The solar cell of the sample 12 was fabricated in the way similar to the sample 1, except that the volume of the acetonitrile solution was not 3 microliters but 1.6 microliters.

(Calculation of Initial Conversion Efficiency and Maintenance Ratio of Solar Cells)

A solar simulator was used for calculation of initial conversion efficiency and maintenance ratio of the solar cells. The output of the solar simulator was configured to be 100 mW/cm$^2$. The solar cells were irradiated with pseudo sunlight. The solar cell was heated due to the irradiation.

The initial conversion efficiency of the solar cells of the samples 1-12 was calculated. The term "the initial conversion efficiency" means photoelectric conversion efficiency of the solar cell measured just after the solar cell was fabricated.

The maintenance ratio of the conversion efficiency of the solar cells of the samples 1-7 and 11 was calculated. The maintenance ratio was calculated on the basis of the following mathematical formula (MI)

(Maintenance ratio)=(Conversion Efficiency after the heating)/(Initial Conversion Efficiency) (MI)

The term "Conversion Efficiency after the heating" means photoelectric conversion efficiency measured after the solar cell was irradiated with the pseudo sunlight at temperature of 85 degrees Celsius for 300 hours.

The molar ratio of Li to Ti was calculated on the basis of an inductively coupled plasma atomic emission spectrophotometry method (hereinafter, referred to as "ICP-AES method").

The molar ratio of LiTFSI to PTAA is a molar ratio of LiTFSI to PTAA in the second semiconductor layer.

Needless to say, the durability is improved more with an increase in the maintenance ratio.

The following Table 1 shows these calculated results.

TABLE 1

|  | Molar ratio of Li to Ti in First semiconductor layer 3 | Molar ratio of LiTFSI to PTAA in Second semiconductor layer 6 | Initial conversion efficiency | Maintenance Ratio |
|---|---|---|---|---|
| Sample 1 | 0.04 | 0.15 | 18.6% | 83% |
| Sample 2 | 0.02 | 0.24 | 20.4% | 88% |
| Sample 3 | 0.04 | 0.24 | 20.9% | 88% |
| Sample 4 | 0.06 | 0.24 | 20.8% | 87% |
| Sample 5 | 0.04 | 0.03 | 16.1% | 82% |
| Sample 6 | 0.00 | 0.03 | 15.6% | 73% |
| Sample 7 | 0.00 | 0.24 | 18.7% | 51% |
| Sample 8 | 0.00 | 0.30 | 6.2% | Not measured |
| Sample 9 | 0.04 | 0.30 | 7.7% | Not measured |
| Sample 10 | 0.04 | 0.28 | 15.9% | Not measured |
| Sample 11 | 0.04 | 0.26 | 19.7% | 96% |
| Sample 12 | 0.04 | 0.08 | 16.5% | Not measured |

As is clear from the comparison of the samples 5, 2-4, and 9 with the samples 6, 7, and 8, respectively, Li is added to the first semiconductor layer 3 to raise the maintenance ratio, regardless of the molar ratio of LiTFSI to PTAA. As demonstrated in the samples 1-4, even if the molar ratio of LiTFSI to PTAA is increased to not less than 0.15, the solar cell has a high maintenance ratio of not less than 80%. The present inventors believe that this is because Li is added to the first semiconductor layer 3 to prevent the LiTFSI from being dispersed from the second semiconductor layer 6 toward the first semiconductor layer 3.

In the second semiconductor layer 6, if the molar ratio of LiTFSI to PTAA is not less than 0.15 and not more than 0.26, the initial conversion efficiency is improved. On the other hand, in case where the molar ratio is not less than 0.28, the initial conversion efficiency is suddenly lowered, compared to the case where the molar ratio is 0.26. The present inventors believe that this is because a part of the LiTFSI reacts with the perovskite material contained in the photoabsorber layer 5 to decompose a part of the perovskite material. As a result, the photoadsorption property of the photoabsorber layer 5 is lowered.

In the solar cells of the samples 1-4 and 9-11, both the first semiconductor layer 3 and the porous layer 4 contain Li; however, the porous layer 4 does not have to contain Li. In other words, the first semiconductor layer 3 contains Li, whereas the porous layer 4 does not have to contain Li. For example, the first semiconductor layer 3 is formed of titanium oxide, the porous layer 4 is formed of aluminum oxide, and only the first semiconductor layer 3 contains Li. After the first semiconductor layer 3 is formed, the Li-containing solution is applied to the first semiconductor layer 3 by a spin-coating method to add Li to the first semiconductor layer 3. Then, the porous layer 4 may be formed. The formation method of the first semiconductor layer 3 is not limited to the method described in the above examples. For example, the first semiconductor layer 3 may be formed by sintering a mixture of the compound containing Li and the starting material of the electron transport material.

INDUSTRIAL APPLICABILITY

The solar cell of the embodiment according to the present disclosure is widely used as a device for an electric power generation which converts light (e.g., light emitted from the sun or an artificial light source) into electric power. In addition, the solar cell according to the present disclosure is used as a light sensor such as a photodetector or an image sensor on the basis of the function which converts light into electric power.

REFERENTIAL SIGNS LIST

1 Substrate
2 First Electrode
3 First Semiconductor Layer
4 Porous Layer
5 Photoabsorber Layer
6 Second Semiconductor Layer
7 Second Electrode
100 Solar Cell

The invention claimed is:

1. A solar cell, comprising:
  a first electrode;
  a second electrode;
  a photoabsorber layer located between the first electrode and the second electrode;
  a first semiconductor layer located between the first electrode and the photoabsorber layer; and
  a second semiconductor layer located between the second electrode and the photoabsorber layer,
  wherein
  at least one electrode selected from the group consisting of the first electrode and the second electrode is light-transmissive;
  the photoabsorber layer contains a perovskite compound represented by the composition formula $AMX_3$;
  where
    A represents a monovalent cation,
    M represents a divalent cation, and
    X represents a halogen anion,
  the first semiconductor layer contains Li;
  the second semiconductor layer contains $LiN(SO_2CF_3)_2$;
  the second semiconductor layer contains poly[bis(4-phenyl)(2,4,6-trimethylphenyl)amine]; and
  in the second semiconductor layer, a molar ratio of $LiN(SO_2CF_3)_2$ to poly[bis(4-phenyl)(2,4,6-trimethylphenyl)amine] is not less than 0.15 and not more than 0.26.

2. The solar cell according to claim 1, wherein
  a main component of the first semiconductor layer is $TiO_2$.

3. The solar cell according to claim 2, wherein
  in the first semiconductor layer, a molar ratio of Li to Ti is not less than 0.02.

4. The solar cell according to claim 3, wherein
  in the first semiconductor layer, the molar ratio of Li to Ti is not more than 0.06.

* * * * *